United States Patent [19]

Proebsting

[11] Patent Number: 4,649,540
[45] Date of Patent: Mar. 10, 1987

[54] ERROR-CORRECTING CIRCUIT HAVING A REDUCED SYNDROME WORD

[75] Inventor: Robert J. Proebsting, Argyle, Tex.

[73] Assignee: Thomson Components-Mostek Corp., Carrollton, Tex.

[21] Appl. No.: 686,333

[22] Filed: Dec. 26, 1984

[51] Int. Cl.[4] .......................................... G06F 11/10
[52] U.S. Cl. ....................................... 371/37; 371/38
[58] Field of Search .................... 371/37, 38, 39, 40

[56] References Cited

U.S. PATENT DOCUMENTS

| | | | |
|---|---|---|---|
| 3,825,893 | 7/1974 | Bossen et al. | 371/38 |
| 4,345,328 | 8/1982 | White | 371/38 |
| 4,359,772 | 11/1982 | Patel | 371/39 |
| 4,523,314 | 6/1985 | Burns et al. | 371/38 |
| 4,561,095 | 12/1985 | Khan | 371/38 |

Primary Examiner—Charles E. Atkinson
Attorney, Agent, or Firm—Roland Plottel

[57] ABSTRACT

An error-correction circuit for correcting up to one error in an M-bit data field having the conventional number K parity bits associated with it uses a syndrome word having K-1 bits. The data elements are ordered sequentially and the K-1 bit syndrome word points to errors in the data only, not to errors in the parity bits. One of the data addresses in the field is reserved as a no-error flag and a Kth parity check bit associated with the syndrome word flags an error in the parity bits.

12 Claims, 4 Drawing Figures

ERROR-CORRECTING CIRCUIT HAVING A REDUCED SYNDROME WORD

DESCRIPTION

1. Technical Field

The field of the invention is that of integrated circuits data processing, in particular the field of error correction circuits for correcting data errors.

2. Background Art

A well-known technique for correcting errors in data transmission is the Hamming-code method, that corrects for any single error in a set of data bits. There is associated with each set of data bits a set of parity bits. The minimum number, K, of parity bits required to correct a field of M data bits is the lowest number K that satifies the equation:

$$2^K \geq M+K+1$$

A distinctive feature of the Hamming-code method is the placement of the parity bits, which are inserted in the data field at locations where the binary address of that location has a single one. A second distinctive feature is that location zero is not used. This placement requirement is not a problem for circuits fabricated from discrete components since the wires may be grouped in any form that is convenient. The placement requirement does give rise to a substantial problem for integrated circuits, since it is difficult to route correction signals where they are needed. A correction circuit design along Hamming-code principles would have to overcome a substantial decoding and routing problem.

SUMMARY OF THE INVENTION

The invention relates to an error-correction circuit that is adapted to a memory in which data is stored and accessed in a logical field having M data bits, and associated K parity bits, but is output through N terminals, where N is less than M; and in which a set of error-inversion circuits is associated with a subset of the data bits.

A feature of the invention is the use of a spatial arrangement of data bit and parity bit storage, in which the data bits are arranged together and the parity bits are arranged separately from the data bits.

Another feature of the invention is the use of a simplified decoding scheme to correct a single error in the data field, in which a plurality of error inversion circuits, each responsive to a selected one of a subset of data bits of a logical field, is also responsive to a pointer signal formed from a selected set of bits in the syndrome word.

Another feature of the invention is the use of an error inhibit signal to inhibit error correction when an error is present within the logical field, but is not contained in the selected subset of data bits.

Another feature of the invention is the use of a logical data field, the elements of which have consecutive binary addresses, together with a syndrome word that points directly at an error location or serves as a no-error signal when it is equal to a pre-selected binary address.

The invention relates to an error correction circuit that has logical (and, in the preferred embodiment, physical) placement of data bits together and logical (and, in the preferred embodiment physical) placement of parity bits together, the data and parity bits not being intermingled with each other.

A feature of the invention is the use of a simplified decoding scheme to correct a single error in a data field. The simplified decoding scheme is adapted to a circuit having a plurality of outputs—for example 8, each output representing the data from a selected one of plurality of columns of a memory array. In this case, the syndrome word (or error correction pointer) is divided into one set of bits that select the output to be corrected and another set that selects the column within that output to be corrected. It should be noted that a Hamming code error correction circuit does not lend itself to such division.

BEST MODE OF CARRYING OUT THE INVENTION

An important feature of this invention is the use of an error correction circuit in an integrated circuit memory in which the output data field is a subset of the data field over which error correction is applied. The function of this circuit is to improve the yield of the chip by correcting for a defective memory cell or other circuit. The error correction circuit will also function to correct for soft errors. The use of a larger data field for error correction compared to the output data field decreases the percentage of extra bits needed for error correction.

The economic benefits of the use of this approach of yield improvement will be evident. Since the error correction circuit can correct for one error in every logical group, such as in every row, it is possible, in principle, to have one defect in every row of the chip and still have a working chip. In contrast, circuits which use redundant rows to improve yield have only a small fraction (such as 2%) of the rows in duplicate form.

This invention was made in the course of developing a large integrated circuit memory. Inventions that may be used together with the present invention are disclosed in copending patent applications Ser. No. 686,331, filed Dec. 26, 1984 and Ser. No. 686,332, filed Dec. 26, 1984, assigned to the assignee hereof and incorporated herein by reference.

Figure 1:
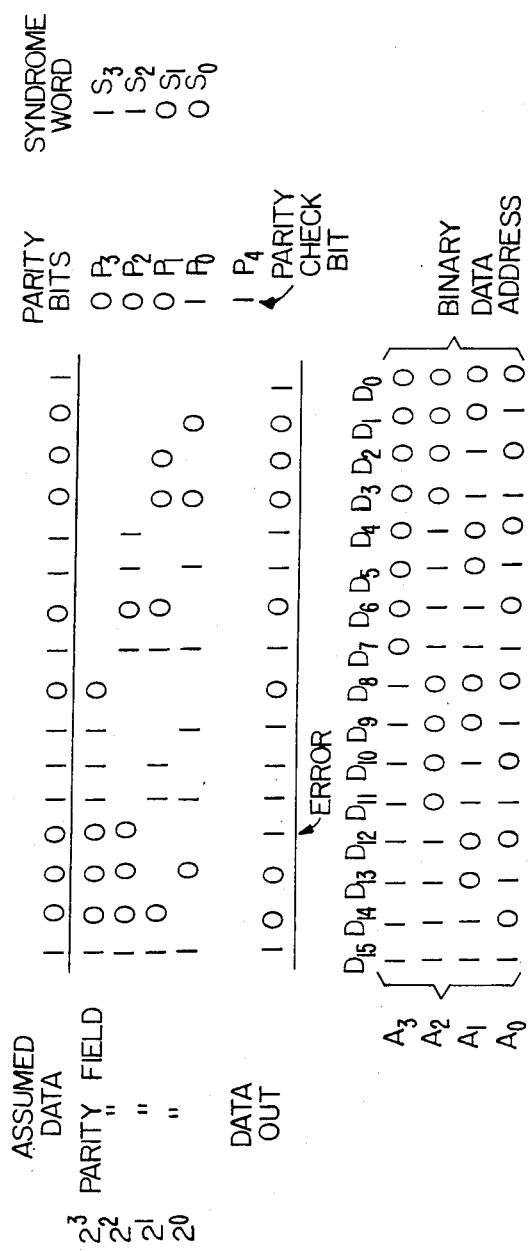
FIG. 1 illustrates an example of the application of the decoding scheme to a sample set of data.

Referring now to FIG. 1, there is shown an example of the decoding scheme used in this invention. A set of 16 assumed input data elements forming a data field on the top row is labeled near the bottom of the figure as $D_0$ to $D_{15}$. Below the D labels are the binary representation of that number. The binary number, ranging from 0000 in the right hand column to 1111 in the left hand column will be referred to as the address of the data element having address bits labeled $A_3$ to $A_0$. To the right is a set of 4 parity bits, $P_3$ through $P_0$, below which is a single parity check bit, $P_4$.

Below the input data is a set of four parity data fields that contain the data elements that are used to form the elements of the set of parity bits ($P_0$ to $P_4$). It can be seen that a data element is selected into the n'th parity field if the n'th bit in the binary address of that element is a one. This method of selection will be referred to in this application as grouping in powers of two. An equivalent method would be to select the data elements corresponding to zeros in the binary address.

To the right of the parity fields are a set of five parity bits. The four bits labelled $P_0$ to $P_3$, the subscript indicating the power of 2 that was used to select data elements in that parity field, are formed by simply counting the number of ones in its respective parity field. The parity bit will be one if there is an odd number of ones in the data bits in the parity field and zero if there is an even number of ones. Bit $P_4$ is a check bit on the parity bits and is set to make an even number of ones in the set of parity bits $P_0$–$P_4$.

Below the set of parity fields there is an assumed set of output bits containing an error in column $D_{12}$ (or 1100). To the right of the figure is a four-bit syndrome word ($S_3$ to $S_0$) that is formed by doing the same parity-determining operation on the set comprising the output data, grouped in parity fields, together with the parity bits corresponding to the parity field. For example, element $S_3$ of the syndrome word is 1 because there are five ones (odd number) in the set of elements $D_8$ through $D_{15}$ (data out) and element $P_3$. The syndrome word is equal to the binary data address of the incorrect data element and the data elements have sequential binary addresses. This last feature is very helpful in the integrated-circuit environment because it makes the problem of decoding and routing wires much easier than would be the case if a Hamming-code method were used.

It should be noted that in this scheme, the data in column zero is never tested and thus an error in that column cannot be corrected. This feature is a disadvantage when compared to the Hamming-code method, but the advantages of ease of layout, together with the fact that the circuit is used to improve yield primarily, make it a beneficial tradeoff.

The fact that this circuit is used to improve yield means that those circuits having an error in the first bit of the data field (or in whatever bit is left untested) will simply be scrapped. The remaining circuits will have a perfect first bit and at most one tolerable error in the other bits comprising any data field. The fraction of circuits that will be scrapped with this method can be calculated by noting that the bulk of the area in the ROM is in the memory matrix so that one out of N (in this example one out of 16) of those circuits that have a single error will be scrapped. In practice, the error correction field will typically be larger, say 64 bits, so that even a lower percentage will be scrapped.

Figure 2:
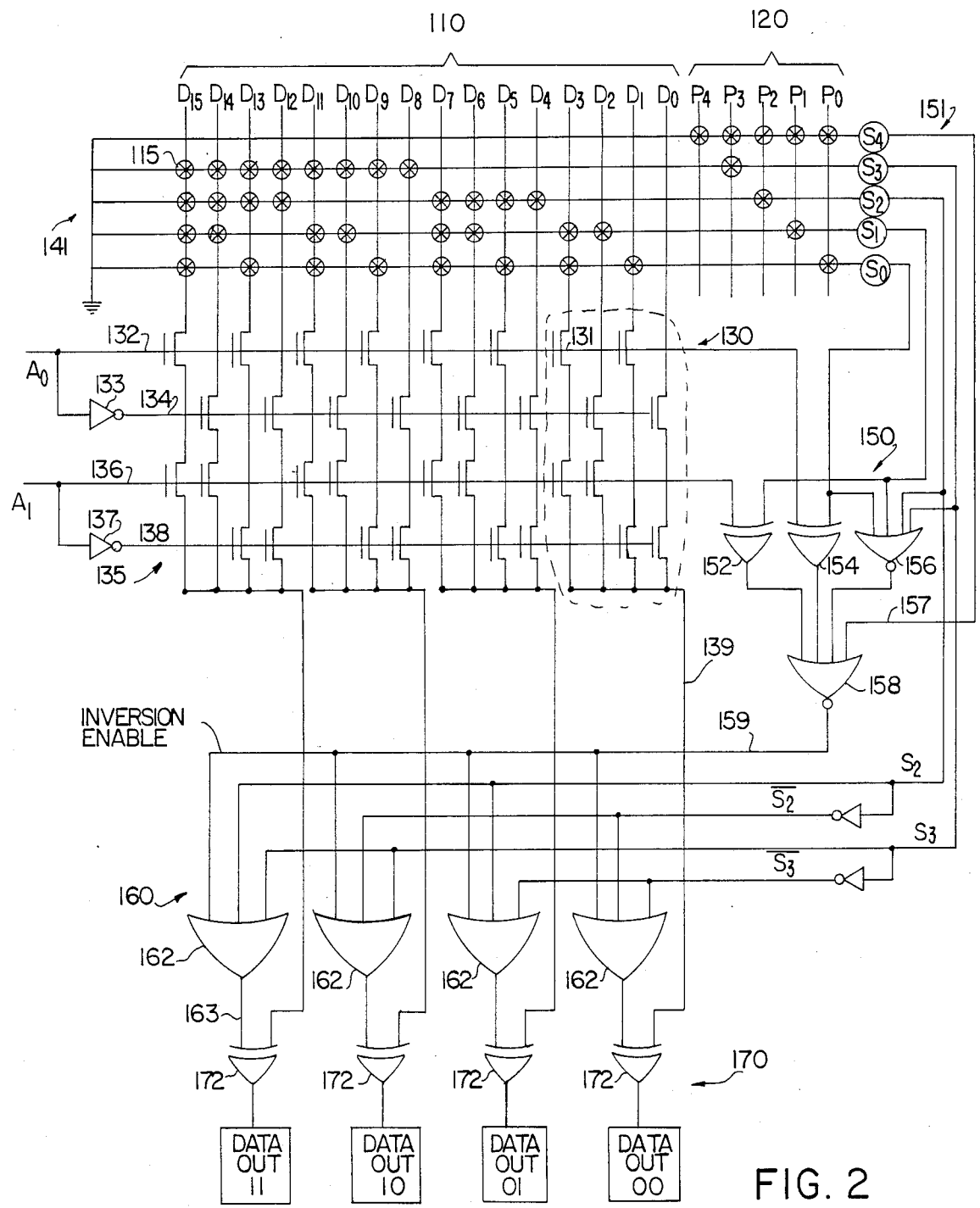
FIG. 2 illustrates an overall view of an embodiment of the invention.

Referring now to FIG. 2, there is shown in partially pictorial, partially schematic form an error correction and decoding circuit to process the same 16 bits of data and 5 bits of parity. The data lines are indicated collectively by the bracket labeled 110 and parity lines by the bracket labeled 120. These lines may come directly from a memory matrix or, alternatively, may result from other decoding and/or amplification steps. Near the top of the figure, a set of exclusive-OR circuits (on lines 141) represented by a circle with an X, as indicated by numeral 115, and shown in FIG. 3, combine to perform parity checks on one data field and its parity bit referred to above. The first level of check on lines 1, 3, 5 etc. and parity bit $P_0$ results in the signal called S0. The second, third, and fourth combinations of circuits follow the scheme described above of combinations of 2 or powers of 2 to result in the signals labled S1, S2, and S3 which collectively form syndrome word 151.

It is useful to refer to the signals, on lines 141, as being a set of intermediate data parity signals that are formed from the parity operation and the result of the parity exclusive—OR circuit as a counterpart parity signal, so that syndrome bits $S_0$ through $S_3$ are formed by combining the intermediate data parity signal shown with the counterpart parity signal shown. The last level of exclusive-OR circuits is a combination of all 5 of the parity bits to form signal S4 that, if a logical one, indicates an error in one of the parity bits $P_0$ through $P_4$, but not in the data. It is used in this scheme differently from the way it is in the Hamming-code scheme. In the prior art method, all 5 parity bits needed to correct a 16-bit data field are used to form the syndrome word. If an error exists, the five-bit syndrome word points to the error location for correction.

In the present invention, an error in the parity bit set means that no error correction can be performed because, if the presumed single error is in a parity bit rather than a data bit, the syndrome word does not point to a valid error location. Signal S4 is thus used to inhibit all error correction.

The 16 data lines are divided into 4 groups of 4, each group of which enters a one out of four selection circuit referred to by the numeral 130. The total selection stage is referred to by the numeral 135. Within this circuit, four sets of two pass transistors are controlled by inputs that are the least significant two bits of the address of the data column. In a more complex example, the column address bits would be decoded in a conventional decoder.

An important point of this line reduction feature is that a space on the integrated circuit which was taken up by four data lines is available for decoding the syndrome word and inverting any error that is present. This is extremely convenient because the circuits take up more room than a single data line, so that what would be an awkward and difficult layout problem is neatly solved.

As a result of this one out of four selection, there are necessarily four logically independent data fields within the 16 lines 110. Only one of these fields can be accessed on any given memory cycle. This separation is another advantagous feature of the overall memory circuit of which this invention is a part because it simplifies the task of correcting an error after the syndrome word points to the error.

In FIG. 2, to the right of selection circuits 135, circuit 150 partially decodes syndrome word 151 and compares the two lowest bits from syndrome word 151 with the two lowest bits of the column address. The function of circuit 150 is to generate a signal on line 159 that will be referred to as Inversion Enable, for reasons to be described below. Line 157 carries signal $S_4$ that, when a logic one, will inhibit error correction. When $S_4$ is a logic one, there is an error in the parity bits. Since this error-correction scheme can handle only one error, then no data error can be corrected in this case. If a circuit has a single defect in the parity cells or lines, the logic one on line $S_4$ will prevent any good data bit from being inverted. It does this by providing a logic one input to NOR gate 158, which guarantees a logic zero on Inversion Enable.

If there are no errors present, the syndrome word consists of all zeros, thus pointing to column zero, whether or not column zero had an error. It is assumed that column zero is correct, so provision must be made to prevent the error correction circuit from inverting data in column zero. NOR circuit 156 has all four bits $S_0$ through $S_3$ as input. Its function is to respond to the binary input (0000), the address of the first data column and disable error correction when the syndrome word points to column zero.

The exclusive-OR circuit 152 compares the least significant bit of the column address ($A_0$) with that of the syndrome word ($S_0$). Likewise, exclusive-OR circuit 154 compares $A_1$ and $S_1$. If both circuits 152 and 154 are matches they provide logic zeroes into their respective inputs of NOR gate 158. If these conditions are met and $S_4$ is a logic zero (indicates no error in the parity bits) and the output of NOR gate 156 is zero (indicates the syndrome word points to a column other than column zero), then NOR gate 158 has all logic zeros as inputs. In this case, the output of NOR gate 158 is a logic one, enabling Inversion Enable. This indicates that an error is present, the error is not in the parity bits, and the error is in the one out of four set of columns that have been selected by the two lowest order address bits. The logic one on Inversion Enable line 159 will permit the error to be corrected by the circuitry to be described below. A very important layout advantage of this invention that is not possible with the conventional Hamming code is the easy and regular arrangement in silicon of the circuitry that is required for this selection. A one out of eight or other selection could be handled also, just as easily.

The circuits labelled collectively by the numeral 160 and placed on-pitch with selection circuits 130 form a second stage of syndrome word decoding. In this case, line 159, the output of NOR gate 158, serves as input to four AND gates 162 and enables the decoding that is effected by the two high order bits of the syndrome word. When line 159 is a logic one, there is an error and it is in the set of bits that have passed through selection circuit 135. The decoding of bits $S_2$ and $S_3$ of the syndrome word enables the correct one out of the four circuits 172 that is to perform the inversion. It is evident from the drawing that the same advantages of regular layout that were described above apply here also. In particular, it is especially convenient that the syndrome word breaks cleanly into a first group of bits going into exclusive-OR circuits 152, 154, etc., and a second group of bits going into AND gates 162.

The error inversion of circuits 170 is straightforward. The function of exclusive-OR circuits 172 is to act as a switched inverter, i.e., a circuit that either inverts the incoming data or passes it directly through. If one of control lines 163 is a logic one, then the corresponding circuit 172 inverts the data from the memory array. If line 163 is a logic zero, then circuit 172 merely passes the data through.

The layout benefits of using error correction increase as the size of the data field increases, for then the area taken by the parity bits becomes relatively smaller. In a particular case that has been implemented, the data field is 64 bits long, so there are six parity bits, plus one parity check bit. If a Hamming-code approach were used, there would have to be 64 7-bit decoders to respond to the parity bits and 64 exclusive-OR circuits to perform the inversion. If the subject inventions were used, with an 8-bit output, there would be 8 exclusive-OR circuits in circuits 170, 8 4-input AND gates in circuits 160 and 3 exclusive-OR gates in circuits 152, etc., a 5-input NOR gate 158 and a 6-input NOR gate 156 in circuit 150. The improvement in layout convenience will readily be evident to those skilled in the art.

Figure 3:
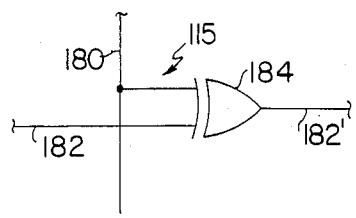
FIG. 3 illustrates one embodiment of a sub-circuit of FIG. 2.

Referring now to FIG. 3, the exclusive-OR symbol of an X in a circle that was used in FIG. 2 is illustrated. The N'th column line, 180, is crossed by one of the horizontal lines that will emerge as one of the bits of the syndrome word. Exclusive-OR circuit 184 combines a signal coming in from the left with one coming in from the vertical line to generate a signal that exits on the right on line 182' to the next stage. Circuit 184 is conventional.

Figure 4:
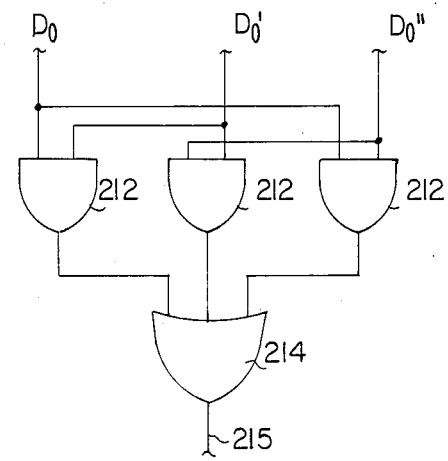
FIG. 4 illustrates a method of correcting a single column.

In the illustrated embodiment, systems considerations for a memory were such that it was preferable to scrap circuits in which the column excluded from the error correction circuit was defective. In other systems, the tradeoff may be different. In that case, any of a number of supplementary error-correction means may be used to correct for column $D_0$ separately. In FIG. 4, circuit 210 is a straightforward majority-rule circuit that has as input column $D_0$ and supplementary columns $D_0'$ and $D_0''$, programmed with the same data as $D_0$. The purpose of this circuit is to take a vote of the three inputs and to put out the value carried by the majority. The inputs are combined in pairs in the three AND circuits 212. At least one of these circuits will provide a logical one output if any two of the inputs are logical ones. OR circuit 214 produces a logical one output if two or more of the three inputs $D_0$, $D_0'$ or $D_0''$ are a logical one. Thus, the output 215 of OR gate 214 agrees with the majority when the true value of the data is a logical one. When all three inputs are logical zero, the outputs of AND gates 212 and of OR gate 214 are also all zero. If only one input is incorrectly at a logical one, the output of the AND and OR gates will still be a logical zero, so that output 215 is a zero. Thus, the output is correct for a single error among the three inputs $D_0$, $D_0'$ and $D_0''$. Those skilled in the art will readily be able to devise equivalent embodiments of the scheme of FIG. 4.

I claim:

1. An integrated circuit error-correction circuit for correcting up to one error in a data field carried by M data signals on a set of data lines (110) disposed in
   a first region of said integrated circuit, each of said set of data lines having a sequential binary data address representative of the location of that data line within the set of data lines;
   said circuit further comprising a set of parity lines (120) carrying a set of K parity signals formed in a predetermined manner from a set of input data signals where K is the least integer which satisfies the equation $2^K \geq M+K+1$;
   parity means for combining said set of parity signals and said data signals in a predetermined manner to generate a binary syndrome word (151) having K-1 bits; and
   means (170) connected to the output of said parity means, for correcting a single data signal located at a binary error address specified by the contents of said syndrome word.

2. An integrated circuit according to claim 1, in which said syndrome word is equal to a binary data address of magnitude less than or equal to M.

3. An integrated circuit according to claim 2, further comprising
   first syndrome comparison means (150) for comparing a first selected subset of contiguous bits of said syndrome word with a counterpart subset of fieldidentification bits, received from a selection stage (135), defining a subset of said data field and generating therefrom an error correction enabling signal on an output line (159).

4. An integrated circuit according to claim 3, in which
said first syndrome comparing and generating means further combines said parity check bit with other signals to inhibit error correction when said parity check bit ($P_4$) indicates an error in said parity signals.

5. An integrated circuit according to claim 3, further comprising second syndrome decoding means for decoding a second selected subset of contiguous bits from said syndrome word and combining said second subset of bits with said error correction enabling signal to control a selected one of a set of data inversion circuits.

6. An integrated circuit according to claim 2, in which said means for correcting a data signal responds to a predetermined one of said binary data addresses to inhibit error correction operation.

7. An integrated circuit according to claim 1, in which said parity means combines said K parity signals to form a parity check bit indicative of the parity of said K parity signals.

8. An integrated circuit according to claim 1, in which $M = 2^{K-1}$, whereby said syndrome word points to errors within said data field only.

9. An integrated circuit error-correction circuit for correcting up to one error in a data field carried by M data signals on a set of data lines disposed in a first region of said integrated circuit, each of said set of data lines having a sequential binary data address representative of the location of that data line within the set of data lines;

said integrated circuit further comprising a set of parity lines carrying a set of K parity signals formed in a predetermined manner from a set of input data signals;

parity means for combining said set of parity signals and said data signals in a predetermined manner to generate a binary syndrome word (151) and a parity check bit dependent only on said parity signals; and means (170) connected to the output of said parity means, for correcting a single data signal located at a binary error address specified by the contents of said syndrome word.

10. An integrated circuit according to claim 9, in which said means for correcting a single data signal receives said parity check bit as input and inhibits error correction in response to a predetermined state of said parity check bit, whereby only errors within said data field may be corrected without inhibition.

11. An integrated circuit error-correction circuit for correcting up to one error in a data field carried by M data signals on a set of data lines (110) disposed in a first region of said integrated circuit, each of said set of data lines having a sequential binary data address representative of the location of that data line within the set of data lines;

said integrated circuit further comprising a set of parity lines carrying a set of K parity signals formed in a predetermined manner from a set of input data signals where K is the least integer which satisfies the equation $2^K \geq M+K+1$, said set of parity lines being disposed within a second region, whereby said parity lines and data lines are not intermingled;

parity means for combining said set of parity signals and said data signals in a predetermined manner to generate a binary syndrome word (151) in which a seleted set of intermediate data parity signals (141) is formed by grouping said data signals in powers of two and in which each of said set of intermediate signals is combined with a counterpart parity signal to form a bit of said binary syndrome word (151); and means (170) connected to the output of said parity means, for correcting a single data signal located at a binary error address specified by the contents of said syndrome word.

12. An integrated circuit according to claim 11, in which said set of intermediate signals and said syndrome word each have K-1 elements, whereby said syndrome word has insufficiant bits to point to errors in both data and parity signals.

* * * * *